(12) United States Patent
Shoji

(10) Patent No.: US 7,176,773 B2
(45) Date of Patent: Feb. 13, 2007

(54) HIGH DENSITY INDUCTOR AND METHOD FOR PRODUCING SAME

(75) Inventor: Shigeru Shoji, Tokyo (JP)

(73) Assignee: TDK Corporation, Tokyo (JP)

( * ) Notice: Subject to any disclaimer, the term of this patent is extended or adjusted under 35 U.S.C. 154(b) by 141 days.

(21) Appl. No.: 10/775,243

(22) Filed: Feb. 11, 2004

(65) Prior Publication Data

US 2004/0164835 A1 Aug. 26, 2004

(30) Foreign Application Priority Data

Feb. 21, 2003 (JP) ............... 2003-043829

(51) Int. Cl.
*H01F 27/02* (2006.01)
(52) U.S. Cl. ...................... 336/200; 336/232
(58) Field of Classification Search ................ 336/200, 336/83, 232
See application file for complete search history.

(56) References Cited

U.S. PATENT DOCUMENTS

| | | | |
|---|---|---|---|
| 5,583,474 A | 12/1996 | Mizoguchi et al. | |
| 5,801,521 A | 9/1998 | Mizoguchi et al. | |
| 5,801,611 A * | 9/1998 | Van Loenen et al. | ....... 336/200 |
| 6,404,317 B1 | 6/2002 | Mizoguchi et al. | |
| 6,593,841 B1 | 7/2003 | Mizoguchi et al. | |
| 6,600,404 B1 | 7/2003 | Kajino | |
| 6,618,929 B2 * | 9/2003 | Kitamura | ................... 29/602.1 |
| 6,847,284 B2 * | 1/2005 | Gamou et al. | ............... 336/223 |

FOREIGN PATENT DOCUMENTS

| | | |
|---|---|---|
| JP | 60-254403 | 12/1985 |
| JP | 02-126610 | 5/1990 |
| JP | 11-176639 | 7/1999 |
| JP | 11-204361 | 7/1999 |
| JP | 2000-036413 | 2/2000 |
| JP | 2001-102235 | 4/2001 |

* cited by examiner

*Primary Examiner*—Ramon M. Barrera
(74) *Attorney, Agent, or Firm*—Oblon, Spivak, McClelland, Maier & Neustadt, P.C.

(57) ABSTRACT

A method for producing a high density inductor includes the steps of forming a coil having a spiral shape, sealing the coil in the interior of a core member, and forming a terminal electrode for allowing electric conduction to said coil on the outside of said core member. In this method, the coil is formed by repeating a process of forming a wire layer by means of a thin film forming process and a process of forming an additional wire layer on top of the wire layer by means of the thin film forming process to pile up the wire layers. With this production method, it is possible to form a coil with a high aspect ratio. In addition, the inductor is designed in such a way that the core member envelopes only the coil. With that design, it is possible to make the inductor compact.

2 Claims, 17 Drawing Sheets

HIGH DENSITY INDUCTOR AND METHOD FOR PRODUCING SAME

BACKGROUND OF THE INVENTION

1. Field of the Invention

The present invention relates to an inductor for use in an electronic circuit and a method for producing the same. More specifically, the present invention relates to a high density inductor that is reduced in size to allow high density mounting on a substrate and a method of producing such a high density inductor.

2. Related Background Art

An inductor as an electronic part has the property of storing current energy. Inductors are used in DC-DC converters, switching power sources and other devices and equipped in various electronic apparatuses.

In recent years, with downsizing and thickness reduction of electronic apparatuses such as cellular phones and personal digital assistants (PDAs), downsizing and thickness reduction of inductors have been demanded.

In the following, the structure and production method of conventional inductors will be described.

FIGS. 7A and 7B are perspective views showing inductors according to a first prior art. As shown in these drawings, the inductor 1 according to the first prior art has a structure in which a wire 2 having a circular or rectangular cross section is helically wound around a core 3. (The cross section of the wire 2 may also be triangular.)

FIGS. 8A and 8B illustrates a process for producing an inductor according to a second prior art. In the producing process of the inductor according to the second prior art, firstly, an insulating member and an electroconductive member 5 in the form of webs are layered and rolled around a cylindrical core 6 as shown in FIG. 8A. After the insulating member and the electroconductive member 5 are rolled around the core 6, the roll is sliced in the radial direction, so that a plurality of inductors 4 are formed as shown in FIG. 8B.

There is a limit to the downsizing and thickness reduction of the above-described inductor, since its production process includes a mechanical operation of wrapping the electroconductive member around the core.

In order to attain downsizing and thickness reduction of inductor parts, there has been proposed a process for producing a coil by forming a wire layer(s) utilizing vapor deposition or sputtering (i.e. so-called thin film technology) and patterning the wire layer utilizing a resist or the like.

FIGS. 9A to 9D schematically illustrate a process for forming a coil utilizing a thin film technology. Firstly, as shown in FIG. 9A, an electrode film 8 is formed on the surface of a substrate 7 with an insulating layer between by vapor deposition or sputtering, and then a resist is applied to the upper surface of the electrode film 8 by a spin coating process or the like. Then photo etching is performed with a mask (not shown) so that a pattern of the resist 9 is formed as shown in FIG. 9B. After the resist 9 has been patterned, the grooved portions 10 are stopped by vapor deposition, sputtering or deposition of a metal by plating as shown in FIG. 9C. Then superfluous portions on the top surface are ground. After that, the resist 9 is removed, and then the electrode film 8 is removed by milling or wet etching, so that a coil 11 is formed as shown in FIG. 9D. FIG. 10 shows the external appearance of the coil 11 that has been formed by the above-described thin film technology.

The inductor formed by the thin film technology has a relatively small dimension in thickness as compared to its area. Consequently, its magnetic circuit is generally longer than that of conventional wire-wound coils having the same inductance.

In order to avoid deterioration of inductance efficiency (i.e. inductance per unit volume) caused by such elongation of the magnetic circuit, the coil may be designed to have as small spaces within the coil as possible and as large a thickness as possible in order for the coil to have a high aspect ratio. For example, a power inductor through which a current more than several hundred milliamperes flows, the aforementioned coil 11 is designed to have a high aspect ratio with a height of 50 μm or, in some cases, more than 200 μm.

In addition to the above-described process, a process of forming a coil in which copper is naturally grown on the surface of a sheet substrate by plating has also been known. FIGS. 11A to 11D show a process of forming a coil by means of plating. Firstly, as shown in FIG. 11A, an electrode film 8 and a resist 9 are formed on a substrate 7 with an insulating layer between. After that, patterning by means of the photo etching is performed. After the patterning, a material for forming a coil (e.g. copper) is deposited in the groove portions 10 with the electrode film 8 being an electrode so that copper is naturally grown. The growth of the deposit member 12 is stopped just before portions of the deposit member 12 growing in adjacent grooved portions 10 are in contact with each other so that short circuit between those portions of the deposit member 12 is prevented from occurring. After that, the resist 9 is removed as shown in FIG. 1C, and the electrode film 8 is removed by milling or. wet etching as shown in FIG. 1D. Thus a coil 11 is produced.

Other methods of producing a coil have also been known. According to one of them, a coil with a high aspect ratio is formed by forming a film of an electroconductive material having a thickness corresponding to the thickness of the coil and etching the electroconductive film to form narrow and deep grooves in the electroconductive material (see, for example, in Japanese Patent Application Laid-Open No. 2001-102235)

According to another method, a layer of an electroconductive deposit material for forming a coil that has a mushroom cross section profile is grown on an exposed portion of an underlying thin layer and a coating portion of a positive photoresist mask pattern adjacent thereto (see, for example, Japanese Patent Application Laid-Open No. H11-204361).

According to still another method, a flat coil formed on one substrate and a flat coil that is formed on another substrate in such a way as to be symmetrical with the former flat coil are arranged to overlap with each other so that the coil surfaces are electrically connected with each other (see, for example. Japanese Patent Application Laid-Open No. H11-176639).

However, the above-mentioned coils formed by a thin film technology or the above-mentioned methods of forming a coil utilizing natural growth by plating suffer from the following problems.

In the coil produced by the above-described thin film technology, the thickness of the resist 9 (i.e. dimension B in FIG. 9B) is large as compared to the width of the resist 9 (i.e. dimension A in FIG. 9B) that corresponds to the space between wires of the coil. In other words, the coil has a cross section with a so-called high aspect ratio (specifically, a resist aspect ratio of equal to or more than 3). Thus, the resist pattern formed after the photo etching becomes slender, and therefore the resist is decreased in strength. Consequently, the resist can be bent as shown in FIG. 12 or removed by pressure of the plating solution or cleaning fluid. In connection with this, inventors' investigations have revealed that when the resist aspect is 5 to 7 or more, it is impossible to produce coils with an acceptable yield.

Furthermore, in the production of a coil with a thickness of more than several tens microns, if the space between the wires of the coil (i.e. the intervals in the radial direction of a spiral coil) is required to be reduced, it is necessary to decrease the wavelength of the exposure light in order to enhance the resolution of the exposure apparatus. However, if the wavelength of the exposure light is decreased, the depth of focus upon exposure is decreased. This causes another problem, that is, the coil pattern cannot be formed deeply in the vertical direction. (On the other hand, when the wavelength of the exposure light is increased, although the depth of focus is increased, the resolution is decreased. As a result, it is impossible to reduce the space between the wires of the coil.)

In addition, use of a magnetic substrate as the substrate 7 is effective in downsizing and enhancement of density of the coil produced by a thin film technology, since the shortest magnetic path can be formed by forming the magnetic path of the coil directly with an insulating layer between. However, in that case, it is necessary to provide a returning magnetic path arranged to coincide with the path of the magnetic lines of force. Consequently, it is not possible to increase the substrate surface density, and therefore it is not possible to increase productivity. In addition, use of a material that are hard to be processed, such as a ferrite, for the substrate causes an increase in cost.

In contrast, in the case that a coil is formed on a non-magnetic substrate and combined with a core member, it is necessary for the sheet to have a thickness of about 35 to 100 μm from the viewpoint of rigidity requirement. Consequently, the ratio of the cross sectional area of the sheet to the cross sectional area of the coil becomes large, so that the occupation density of the coil in the interior of the inductor is unfavorably decreased. The decrease in the occupation density is exaggerated as the size of the coil is reduced, since the thickness of the sheet will not be changed. In any case, the substrate is occupied within the magnetic path, and the downsizing and density enhancement is hindered.

On the other hand, in the process of forming a coil by natural growth by plating, it is possible to reduce the intervals between the deposit member 12 to as small as 10 to 20 microns. However, since the deposit member 12 is formed by natural growth, it is not possible to increase the aspect ratio of the coil to more than 1. In view of this, as a method for increasing the thickness of the coil 11, there has been proposed a method in which the substrate 7 is prepared as a thin sheet and a similar coil is also formed on the backside of the sheet-like substrate. With this method, the electroconductive area of the coil can be increased.

However, even in the above-described method in which coils 11 are formed on both sides of a substrate, it is necessary for the sheet to have a thickness of about 35 to 100 μm from the viewpoint of rigidity requirement. Consequently, the ratio of the cross sectional area of the sheet to the cross sectional area of the coil becomes large, so that the occupation density of the coil in the interior of the inductor is unfavorably decreased. The decrease in the occupation density is exaggerated as the size of the coil is reduced, since the thickness of the sheet will not be changed.

In the process disclosed in Japanese Patent Application Laid-Open No. 2001-102235, there is the risk that a pattern can be bent or removed or the depth of focus at the exposure wavelength can be narrowed like in the case of the above-described coil produced by utilizing a thin film technology.

In the process disclosed in Japanese Patent Application Laid-Open No. H11-204361, there is a limit to improvement in the aspect ratio, since the electroconductive deposit layer of the coil is formed in a mushroom shape. Therefore, it is difficult for that process to attain the aspect ratio that can be realized by the present invention.

In the process disclosed in Japanese Patent Application Laid-Open No. H11-176639, although the aspect ratio of a coil is improved by arranging coils to overlap with each other. However, since the overlapping coils are only a pair of coils, it is difficult for this process also to attain the aspect ratio that can be realized by the present invention.

SUMMARY OF THE INVENTION

The present invention has been made in view of the above-described problems. An object of the present invention is to provide a high density inductor and a method for producing the same with which improvement in the aspect ratio up to high aspect ratios as well as downsizing of the inductor can be realized.

The present invention has been made based on the inventive concept that a coil with a high aspect ratio can be produced eventually by forming coils with small aspect ratios utilizing a thin film technology while piling up those coils in the thickness direction.

According to the present invention there is provided a high density inductor comprising a coil having a spiral shape and a core member disposed in such a way as to coincide with a path of a magnetic line of force generated by the coil, wherein the coil has a form in which a plurality of wire layers are piled up in a thickness direction, and the wire layers are formed by a thin film forming process. It is preferable that the ratio of the thickness of the coil to the line width of the wire layers be equal to or more than 1.

According to the present invention there is also provided a method for producing a high density inductor comprising the steps of forming a coil having a spiral shape, sealing the coil in the interior of a core member, and forming a terminal electrode for allowing electric conduction to the coil on the outside of the core member, wherein the coil is formed by repeating a process of forming a wire layer by means of a thin film forming process and a process of forming an additional wire layer on top of the wire layer by means of the thin film forming process to pile up the wire layers.

According to a more specific form of the present invention, there is provided a method for producing a high density inductor comprising the steps of forming a coil having a spiral shape, sealing the coil in the interior of a core member, and forming a terminal electrode for allowing electric conduction to the coil on the outside of the core member, wherein the coil is formed by a process comprising the steps of forming a groove portion corresponding to the shape of the coil in a resist by photo etching, depositing a metal in the groove by plating to form a wire layer, then removing the resist, applying the resist up to a height beyond the wire layer, forming a groove portion on top of the wire layer by photo etching again, then forming an additional wire layer by depositing the metal in the groove portion by plating, and repeating piling-up of the wire layers to form the coil with a predetermined thickness.

According to another specific form of the present invention, there is provided a method for producing a high density inductor comprising the steps of forming a coil having a spiral shape, sealing the coil in the interior of a core member, and forming a terminal electrode for allowing electric conduction to the coil on the outside of the core member, wherein the coil is formed by a process comprising the steps of forming a groove portion corresponding to the shape of the coil in a resist by photo etching, depositing a metal in the groove by plating to form a wire layer, then applying the resist again up to a height corresponding to a next wire layer, forming a groove portion on top of the wire layer by photo etching again, then forming an additional wire layer by depositing the metal in the groove portion by plating, and repeating piling-up of the wire layers to form the coil with a predetermined thickness.

In the above-described method according to the present invention, the wire layers may be formed by sputtering instead of plating.

After the above-described process, the coil may be sealed in the core member by forming the coil on a dummy substrate, inserting the coil into the core member while maintaining the aforementioned state, and then removing a part or the whole of the dummy substrate. In addition, the coil may be fixed and sealed by injecting an organic or inorganic adhesive into the interior of the core member and curing the adhesive. Furthermore, an electrode lead-out portion for the coil may be formed on a side surface of the coil either directly or with an insulating layer between after the coil is sealed. Alternatively, after the coil is sealed, a side surface of the coil may be smoothed by grinding, and an electrode lead-out portion for the coil may be formed on the side surface of the coil either directly or with an insulating layer between.

According to the above-described features of the present invention, since a thin film formation process is used to shape a coil, the coil can be made compact and shaped precisely. Consequently, the size of a core member enveloping the coil can also be reduced. Thus, the inductor itself can be made compact.

According to the invention, the coil has a structure in which a plurality of wire layers are piled up, wherein the ratio of the thickness to the wire width or the aspect ratio of each wire layer is designed to be low. In the case that each wire layer is formed by a thin film formation process, it is possible to prevent resist in which a groove portion has been formed from bending or collapsing by setting the aspect ratio as low as a value with which collapse or detachment of the resist is hard to occur. Therefore, it is possible to form a wire layer reliably. Thus, a coil with a large thickness dimension or a high aspect ratio can be eventually formed by repeating the thin film formation process to pile up the wire layers each of which has a low aspect ratio.

When a coil is formed by piling up wire layers by a thin film formation process as described above, it is not necessary to insert, for example, a sheet member or the like in a space inside the coil. Therefore, the structure in which only the coil is enveloped in the core member without any other member can be realized. As a result, it is possible to produce a high density inductor. In addition, since only the coil is enveloped, the inductor can be made compact.

According to a preferred form of the present invention, a coil formed on a dummy substrate is inserted in a core member and then the dummy substrate is removed or detached to isolate the coil. In addition, the coil may be sealed in the core member in such a way that a closed magnetic path is formed. In this way, it is possible to attain downsizing and density enhancement of the inductor. Thus, the mount area and height of the inductor can be reduced. In addition, a smoothing processing by grinding may be performed upon forming an electrode lead-out portion. With that process, it is possible to form the electrode lead-out portion more precisely.

These and other features of the present invention will become apparent by reading the following detailed descriptions of the invention made with reference to the accompanying drawings.

DESCRIPTION OF THE PREFERRED EMBODIMENTS

In the following, specific preferred embodiments of a high density inductor and a method of producing a high density inductor according to the present invention will be specifically described with reference to the drawings.

Figure 1A:
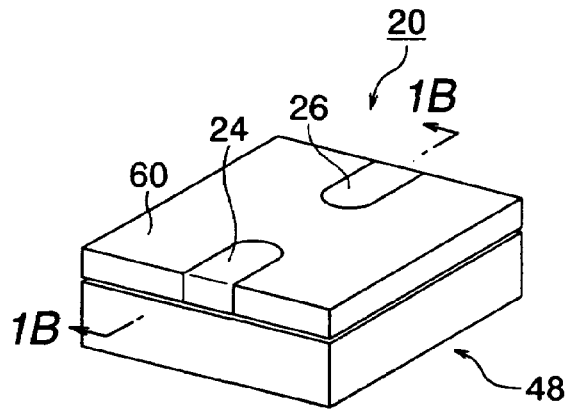
FIG. 1A is a perspective view showing the structure of a high density inductor according to an embodiment of the present invention.
Figure 1B:
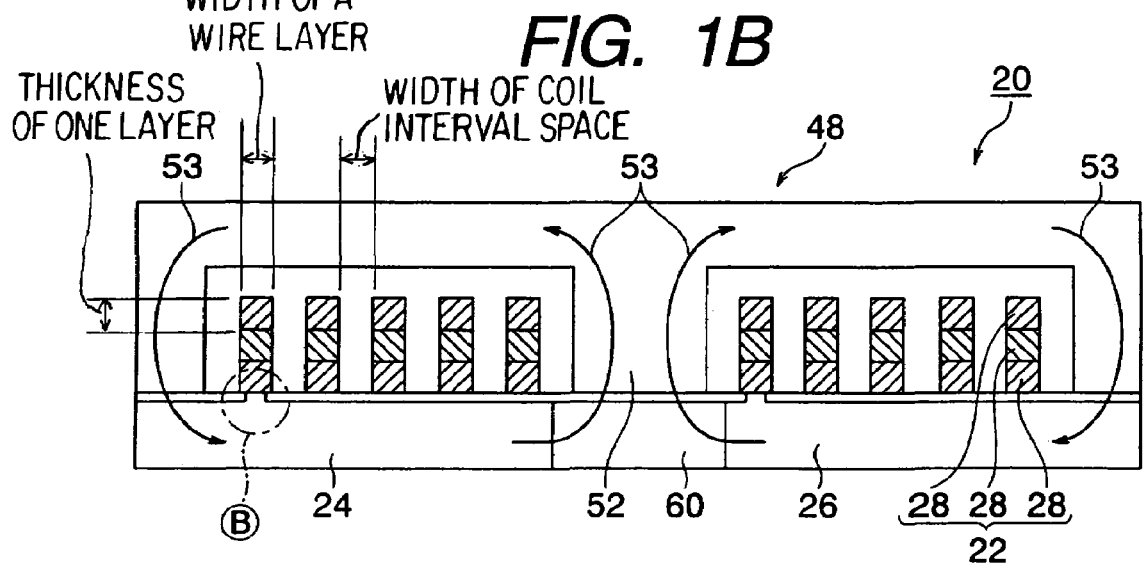
FIG. 1B is a cross sectional view taken along line 1B—1B in FIG. 1A showing the structure of the high density inductor according to the embodiment of the present invention.
Figure 2:
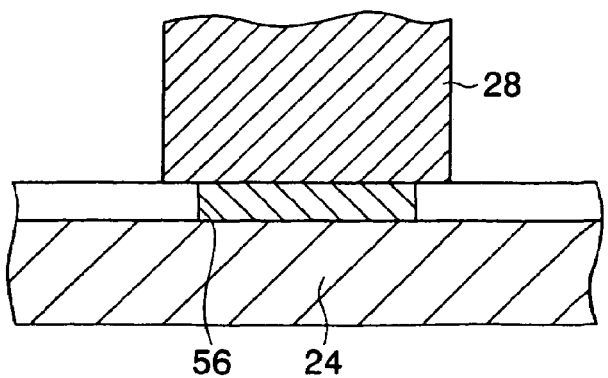
FIG. 2 is an enlarged view showing a part of the high density inductor shown in FIGS. 1A and 1B.

FIG. 1A is a perspective view showing the backside of a high density inductor according to an embodiment of the present invention. FIG. 1B is a cross sectional view of the inductor taken along line 1B—1B in FIG. 1A. FIG. 2 is an enlarged view showing a part of the inductor shown in FIG. 1B. As shown in these drawings, the high density inductor according to this embodiment includes a coil 22 disposed at the center of the inductor 20 and a core member for sealing the coil 22. On the backside of the inductor 20, there is provided a pair of connection terminals 24 and 26, with which the inductor can be mounted on a printed circuit board or the like.

The coil 22 has a layered structure in which a plurality of wire layers 28 (three layers, in this embodiment) are piled up in the thickness direction, so that a high aspect ratio is attained. The coil 22 is formed in a spiral shape with a constant radial pitch from the inner portion to the outer portion. This coil 22 can be formed utilizing a thin film process that is used in producing semiconductor devices. In the following, a process of forming the coil 22 by means of a thin film process will be described.

Figure 3A:
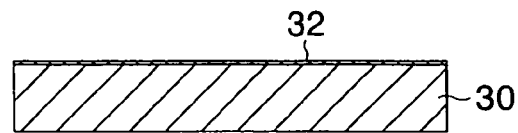
FIG. 3A is a process diagram illustrating a first method for forming a coil.
Figure 3B:
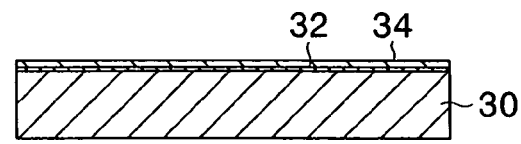
FIG. 3B is a process diagram illustrating the first method for forming a coil.
Figure 3C:
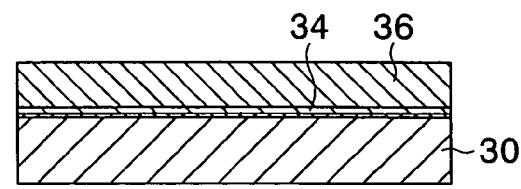
FIG. 3C is a process diagram illustrating the first method for forming a coil.
Figure 3D:
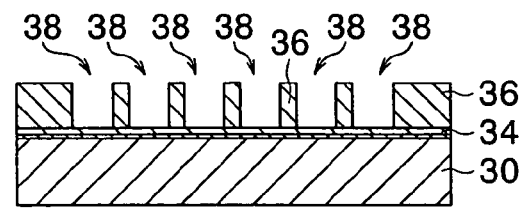
FIG. 3D is a process diagram illustrating the first method for forming a coil.
Figure 3E:
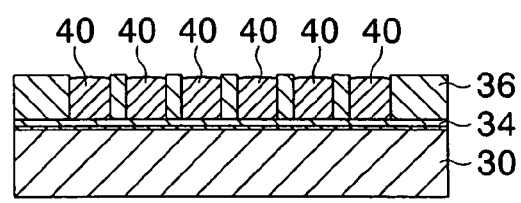
FIG. 3E is a process diagram illustrating the first method for forming a coil.
Figure 3F:
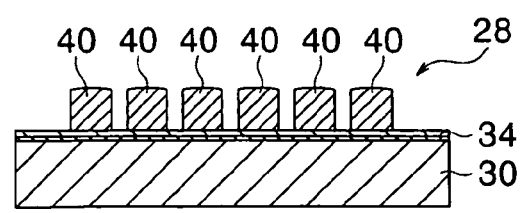
FIG. 3F is a process diagram illustrating the first method for forming a coil.
Figure 3G:
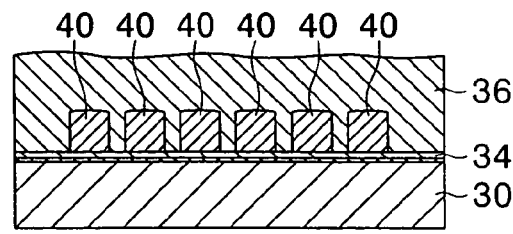
FIG. 3G is a process diagram illustrating the first method for forming a coil.
Figure 3H:
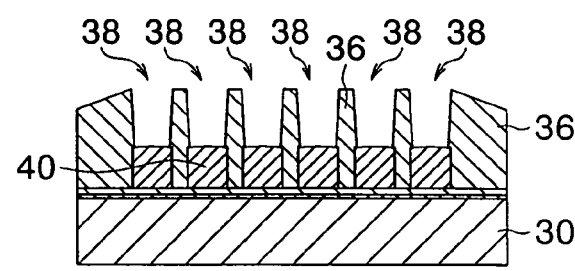
FIG. 3H is a process diagram illustrating the first method for forming a coil.
Figure 3I:
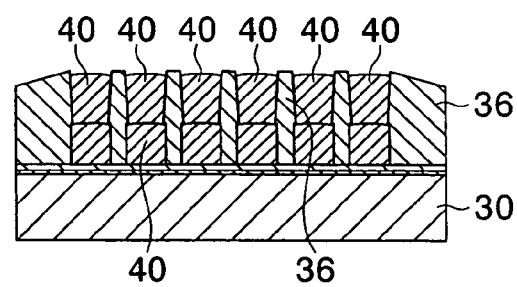
FIG. 3I is a process diagram illustrating the first method for forming a coil.
Figure 3J:
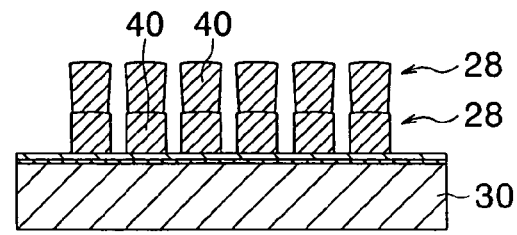
FIG. 3J is a process diagram illustrating the first method for forming a coil.
Figure 3K:
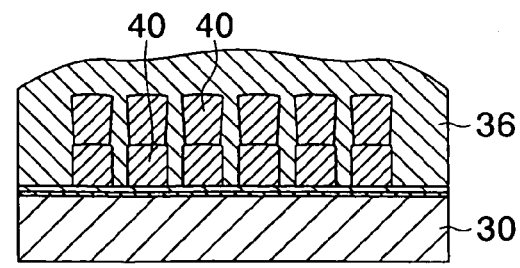
FIG. 3K is a process diagram illustrating the first method for forming a coil.
Figure 3L:
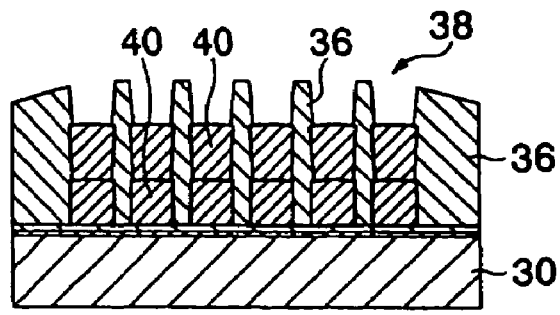
FIG. 3L is a process diagram illustrating the first method for forming a coil.
Figure 3M:
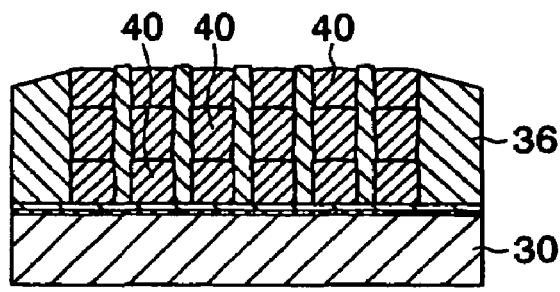
FIG. 3M is a process diagram illustrating the first method for forming a coil.
Figure 3N:
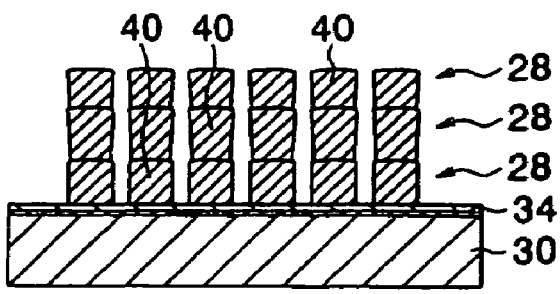
FIG. 3N is a process diagram illustrating the first method for forming a coil.
Figure 3O:
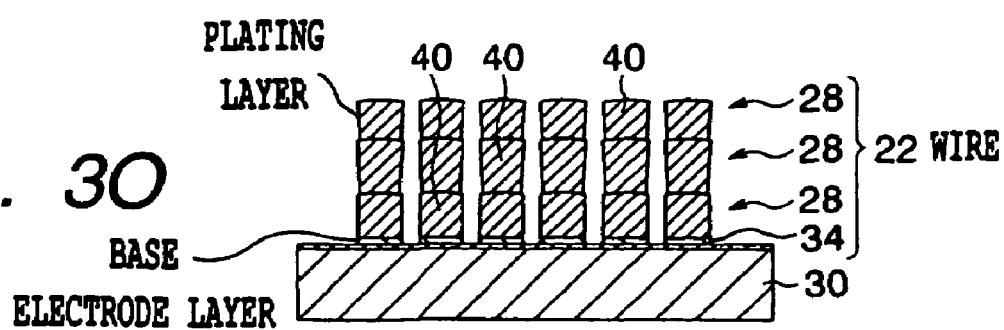
FIG. 3O is a process diagram illustrating the first method for forming a coil.

FIGS. 3A to 3O are process diagrams illustrating a first method for forming a coil. Firstly, an insulating layer 32 is formed on a substrate 30 serving as a base for the coil 22 to be formed as shown in FIG. 3A. Then, as shown in FIG. 3B, a base electrode layer 34 used for deposition by plating is deposited on the upper surface of the insulating layer 32 by vapor deposition or sputtering. After the base electrode layer 34 is formed, a resist (i.e. a photosensitive resin) 36 is applied on the base electrode layer 34 with a uniform thickness. The thickness of the resist coating 36 should correspond to the thickness of each wire layer 28. It is preferable that the resist 36 be applied by a spin coating process in order for its coating thickness to be made uniform.

After the resist 36 is applied with a uniform thickness, the surface of the resist 36 is irradiated with ultraviolet radiation by means of a stepper apparatus or the like, and thereafter a groove portion 38 that defines the plan configuration of the coil 22 (i.e. the configuration or shape of the coil 22 as viewed from above) is formed in the resist 36 by photo etching. This state is shown in FIG. 3D. Then the substrate 30 is dipped in a plating solution and a voltage is applied while using the base electrode layer 34 as one of the electrodes. As a result, a metal is deposited on the groove portion 38 at the bottom of which the base electrode layer 34 is exposed, so that the groove portion 38 is stopped with the deposit member 40. After the groove portion 38 is stopped by the deposit member 40, the resist 36 that defines the groove portion 38 is removed. Thus, a wire layer 28 having a plan configuration corresponding to the coil 22 is formed.

Next, in the following, a process of forming an additional layer on top of the wire layer 28 will be described. In connection with this, in this embodiment, all of the wire layers to be piled up are designed to have the same thickness, and the wire layers and related portions will be designated with the same reference signs throughout the description.

After the lowermost wire layer 28 is formed on the substrate 30, as shown in FIG. 3G, new resist 36 is firstly applied on the base electrode layer 34 in a manner similar to the process shown in FIG. 3C. What is different in the state shown in FIG. 3G from the state shown in FIG. 3C is the height (or the thickness) of the resist 36. Specifically, in the state shown in FIG. 3G, the thickness of the resist 36 is set to correspond to the height of the two layers of the wire layers 28. After the resist 36 is applied up to the prescribed thickness, an additional wire layer 28 (i.e. the second layer) is formed utilizing the resist 36 on which a groove portion 38 has been formed by photo etching in the same manner as the process shown in FIGS. 3D to 3F, as shown in FIGS. 3H to 3J.

After the additional wire layer 28 is formed, resist 36 is newly applied on the substrate 30 up to the height corresponding to three wire layers. Then, as shown in FIGS. 3L to 3M, a further additional wire layer 28 (i.e. the third layer) is formed utilizing the resist 36 on which a groove portion 38 has been formed by photo etching in the same manner as the operations shown in FIGS. 3D to 3F and in FIGS. 3H to 3J. In addition, under the state in which the resist 36 has been removed as shown in FIG. 3N, the exposed base electrode layer 3 is removed by etching or a like process as shown in FIG. 3O.

FIGS. 4A to 4M are process diagrams according to a second method for forming a coil. In the description of the second method, the portions same as the portions in the above-described first method will be designated by the same reference numerals.

The processes shown in FIGS. 4A to 4E are the same as the processes shown in FIGS. 3A to 3E described above. With those processes, an insulating layer 32 is formed on a substrate 30, resist 36 is applied on a base electrode film 34, a groove portion 38 is formed in the resist 36 by photo etching, and then a deposit member 40 is formed in the groove portion 38 by deposition process in a plating solution.

Figure 4A:
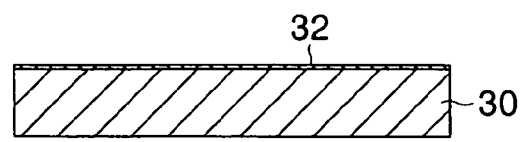
FIG. 4A is a process diagram illustrating a second method for forming a coil.
Figure 4B:
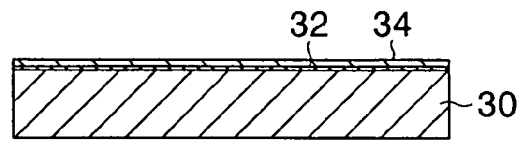
FIG. 4B is a process diagram illustrating the second method for forming a coil.
Figure 4C:
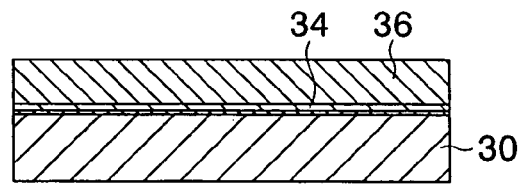
FIG. 4C is a process diagram illustrating the second method for forming a coil.
Figure 4D:
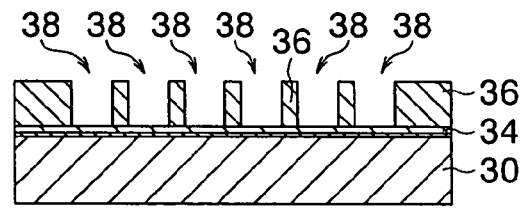
FIG. 4D is a process diagram illustrating the second method for forming a coil.
Figure 4E:
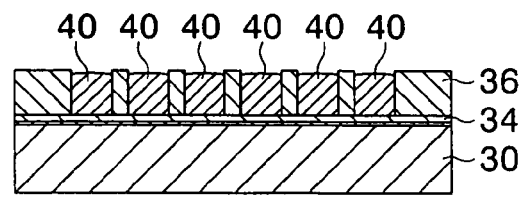
FIG. 4E is a process diagram illustrating the second method for forming a coil.
Figure 4F:
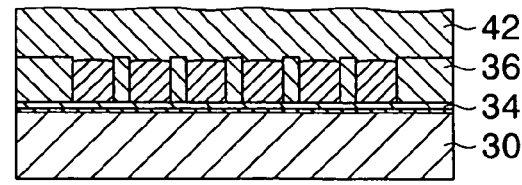
FIG. 4F is a process diagram illustrating the second method for forming a coil.
Figure 4G:
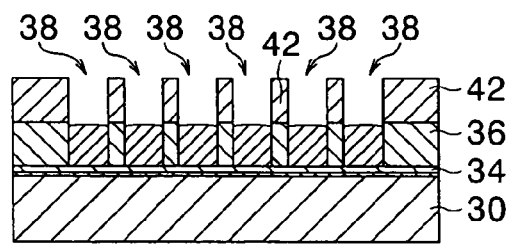
FIG. 4G is a process diagram illustrating the second method for forming a coil.
Figure 4H:
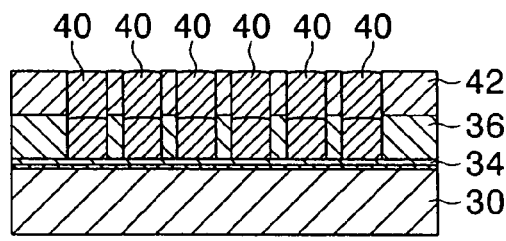
FIG. 4H is a process diagram illustrating the second method for forming a coil.

After the deposit member 40 is formed in the grooved portion 38, the resist 36 is heated or the surface of the resist 36 is covered with a thin film of poly vinyl alcohol or the like so that the resist will not be mixed with resist that will be further applied on it. (This process should be done in order to prevent the state that the underlying resist is dissolved by the solvent of the applied resist to partially spread over the coil and to generate scum that affects the deposit member.) After that, additional resist 42 is applied on top of the resist 36 and the deposit member 40 as shown in FIG. 4F. The coating thickness of the additional resist 42 is designed to correspond to the thickness of one wire layer 28. Then, a groove portion 38 is formed in the resist 42 by photo etching as shown in FIG. 4G, and the deposit member 40 as the second layer is formed in the groove portion 38 by deposition in a plating solution.

Figure 4I:
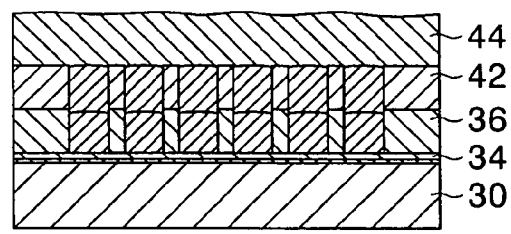
FIG. 4I is a process diagram illustrating the second method for forming a coil.
Figure 4J:
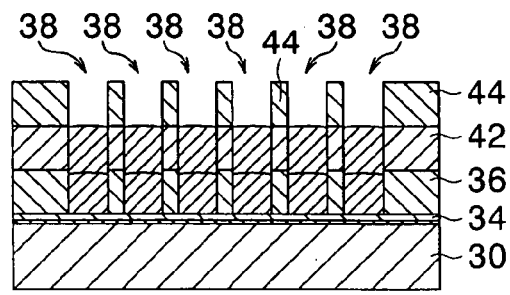
FIG. 4J is a process diagram illustrating the second method for forming a coil.
Figure 4K:
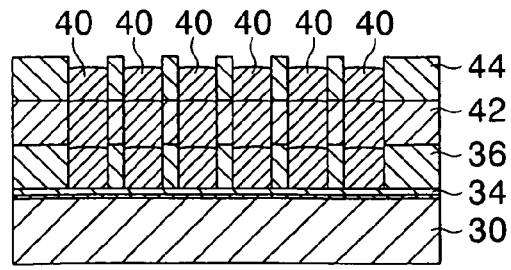
FIG. 4K is a process diagram illustrating the second method for forming a coil.

After the second layer of the deposit member 40 is formed in the groove portion, new resist 44 is applied on top of the resist 42 and the deposit member 40 as shown in FIG. 4I. Then, a photo etching process and a deposition process are carried out as shown in FIGS. 4J and 4K, so that the third layer of the deposit member 40 is formed.

Figure 4L:
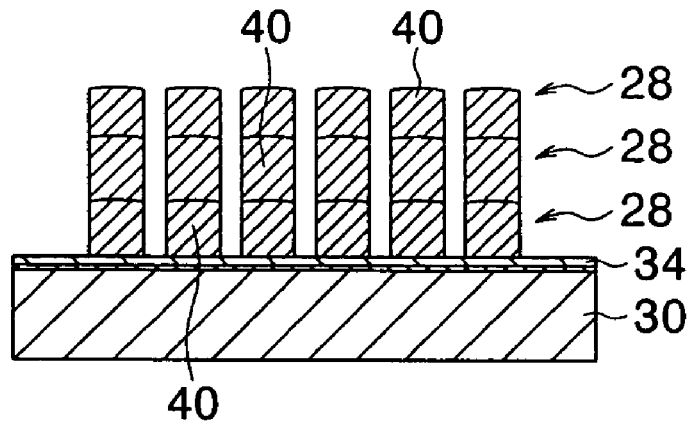
FIG. 4L is a process diagram illustrating the second method for forming a coil.
Figure 4M:
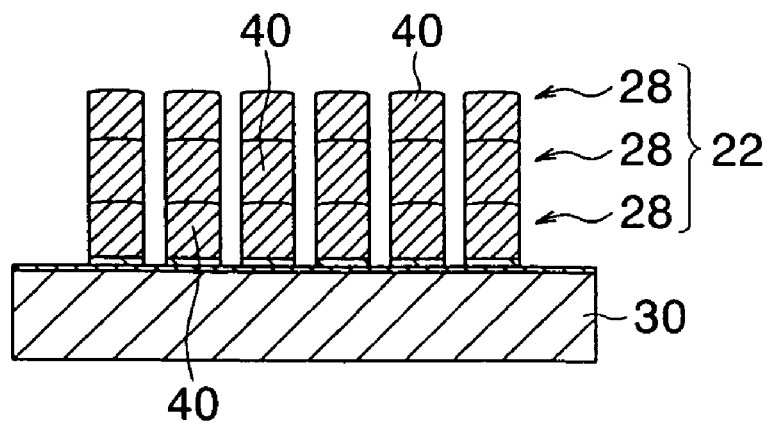
FIG. 4M is a process diagram illustrating the second method for forming a coil.

After the third layer of the deposit member 40 is formed, the resist 36, the resist 42 and the resist 44 are removed at one time as shown in FIG. 4L and then the exposed base electrode layer 34 is removed by etching or a like process as shown in FIG. 4M.

According to the above-described production method, although the aspect ratio or the ratio of the height (or thickness) to the width of each wire layer 28 is small, a coil 22 with a high aspect ratio can be formed by piling up the multiple wire layers 28. In addition, since the wire layers are formed by photo etching, the precision of formation is of the order of microns. Therefore, it is possible to form a compact and high density wire layer with a small line pitch.

Since the coil 22 described above is formed by a thin film process, a plurality of coils 22 can be produced on the substrate 30. In other words, this production method has the additional advantage that many coils 22 can be produced by one production cycle. With such mass production, the cost of producing the coil 22 can be reduced.

The inventor carried out experiments in order to test the effects of the present invention. The results of the experiment will be presented in the following as an example.

EXAMPLE

A coil pattern was formed on a substrate having a base conductive layer. For example in the case that a coil pattern with a thickness of the electroconductive portion of 40 µm and a width of the coil interval space of 10 µm is to be formed, the width of the resist pattern should be 10 µm. The allowable height for the resist of the aforementioned width with which the width of the resist will remain constant and the resist will not be bent is about 40 µm or less. In order to ensure the resolution realizing a resist width of 10±2 µm in both the upper and lower portions of the pattern, exposure light having a wavelength of 360 nm was used.

With the above conditions, the first layer of the coils with the coil width of 40 µm and a spacing of 10 µm was formed.

At that time, all of the coils of the first layer were normally formed on the substrate without being bent, in other words the process yield was 100%.

Next, a pattern of the second layer was formed on top of the first layer. The pattern resist was processed at 130° C. for one hour, and then resist was applied with a thickness of 40 µm. After that, the resist was exposed to a pattern with a resist width of 10 µm, and then plating was performed.

Thus, coils were formed as a pile of the first layer and the second layer, in which high aspect coils with a spacing of 10 µm and a coil height of 80 µm were formed at a yield of nearly 100%.

Then a pattern of the third layer was formed on top of the second layer. The pattern resist was processed at 130° C. for one hour, and then resist was applied with a thickness of 40 µm. After that, the resist was exposed to a pattern with a resist width of 10 µm, and then plating was performed.

Thus, coils were formed as a pile of the first, second and third layers, in which high aspect coils with a spacing of 10 µm and a coil height of 120 µm were formed at a yield more than 95%.

On the other hand, we also formed a coil pattern with a resist thickness two times larger than the above process, i.e. with a thickness of 80 µm.

Resist was formed with a thickness of 80 µm, and a resist pattern with a width of 10 µm was formed. Then a plating process was performed, and the resist was removed. We observed the resultant product to found that the yield of the coils was as low as 65% or less due to bending of the resist or other defects.

Furthermore, we also performed application of resist with a thickness of 120 µm, exposure, and development for patterning. However, a pattern could not be formed without being bent, and the yield of the coils was 0%.

As per the above, it was confirmed that the coil structure and the method of producing coils according to the present invention is an essential technology for producing a high density thin film coil.

In the following, a process of forming an inductor as an end product by sealing the coil 22 in a core member after the formation of the coil 22 on the substrate 30 will be described.

FIGS. 5A to 5J are process diagrams showing a production process of inductors. FIGS. 6A to 6H are enlarged view showing one unit at some stages of the process.

Figure 5A:
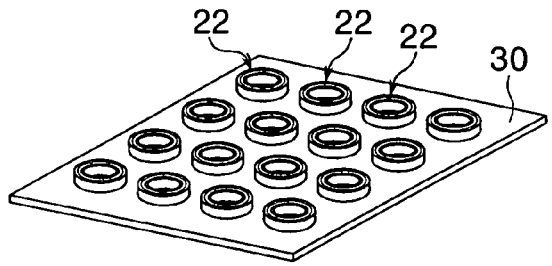
FIG. 5A is a process diagram for producing inductors.
Figure 5B:
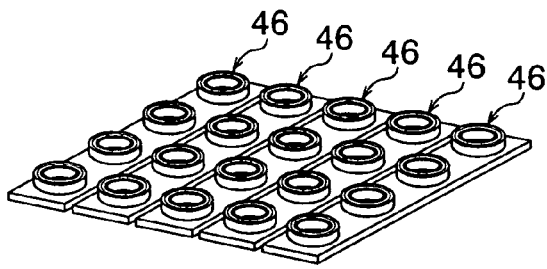
FIG. 5B is a process diagram for producing inductors.
Figure 6A:
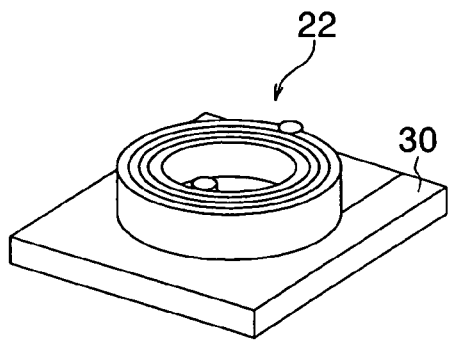
FIG. 6A is an enlarged view showing one unit in one of the stages of the process for producing inductors.

Firstly, a substrate 30 shown in FIG. 5A on which coils 22 have been formed by the above-described method is cut, so that coil bars 46 each of which includes coils 22 arranged in a row are formed. The coil bars 46 under the state in which they are cut from the substrate are shown in FIG. 5B, and one of the coils 22 formed on the coil bar 46 is shown in FIG. 6A.

Figure 5C:
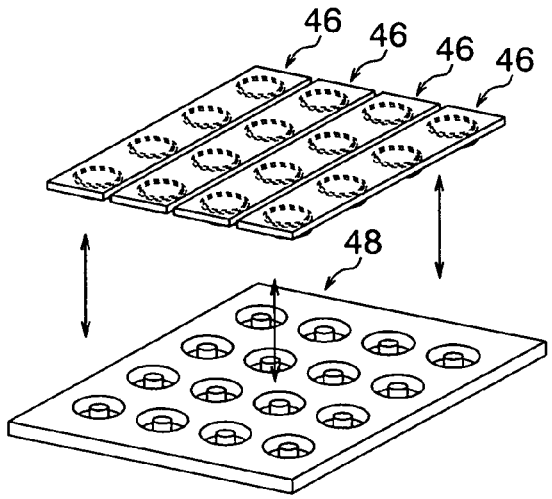
FIG. 5C is a process diagram for producing inductors.
Figure 6B:
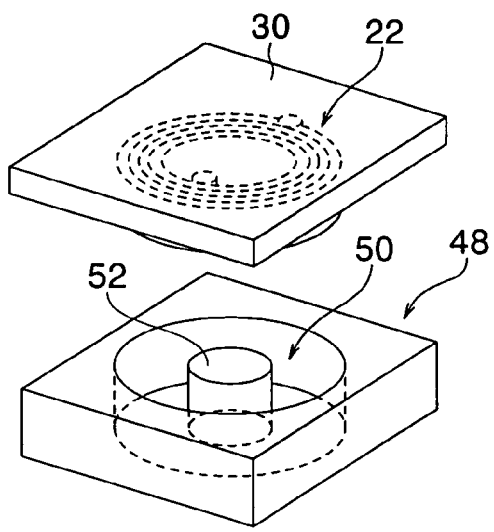
FIG. 6B is an enlarged view showing one unit in one of the stages of the process for producing inductors.

After the coil bars 46 are cut out from the substrate 30, the coil bars 46 are turned over as shown in FIG. 5C and FIG. 6B, and the coils 22 are inserted into an E-core 48 (before cut) disposed below the coil bars 46. The E-core 48 will constitute a part of the core member. The E-core 48 is made of a ferrite having a high magnetic permeability. The E-core 48 has recessed portions 50. The inner diameter and the depth of each recessed portion 50 are large enough to receive a coil 22. At the center of the recessed portion 52A, there is provided a boss 52 having a diameter small enough to be inserted into the central portion of the coil 22. In addition, the outer diameter of the boss 52 is sufficiently large so that magnetic fluxes 53 generated by the coil 22 can pass through it sufficiently. (As to the magnetic flux path, see FIG. 1B.)

Figure 5D:
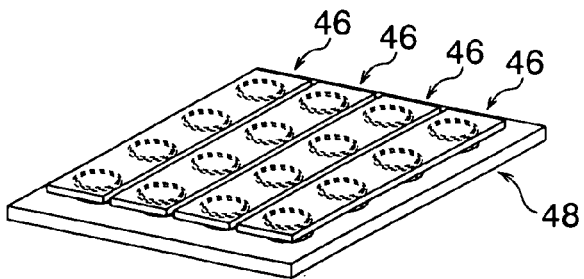
FIG. 5D is a process diagram for producing inductors.
Figure 6C:
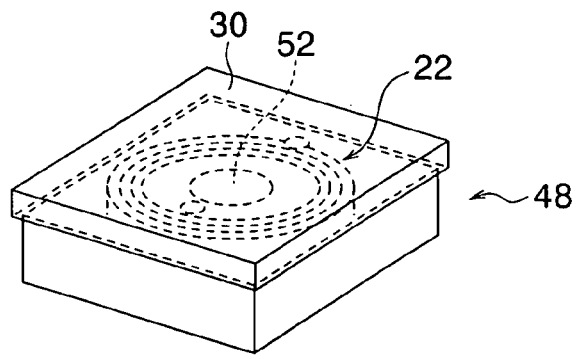
FIG. 6C is an enlarged view showing one unit in one of the stages of the process for producing inductors.

When the coils 22 are to be inserted in the E-core 48, the aforementioned recessed portion should be filled with a thermosetting adhesive so that the coils 22 are dipped in the adhesive. FIG. 5D and FIG. 6C show the state in which the coil bars 46 are dipped in the adhesive so as to be attached to the E-core 48. The coil bars 46 and the E-core 48 thus attached to each other are subjected to vacuum heating so that air bubbles in the adhesive can be removed to the exterior and the adhesive can be cured.

Figure 5E:
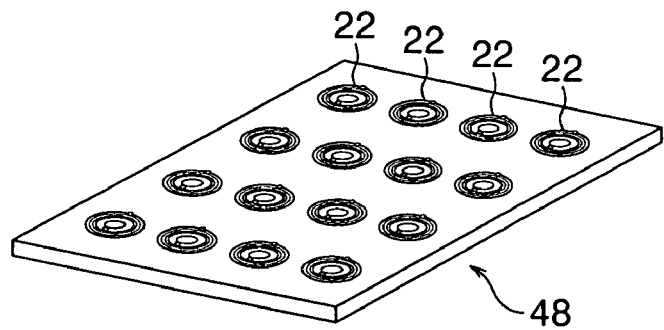
FIG. 5E is a process diagram for producing inductors.
Figure 5F:
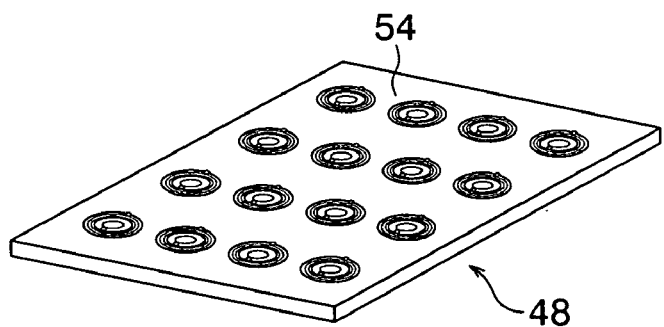
FIG. 5F is a process diagram for producing inductors.
Figure 6D:
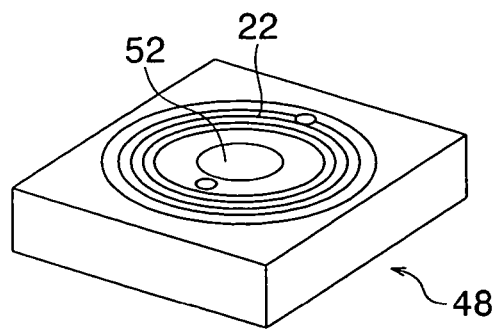
FIG. 6D is an enlarged view showing one unit in one of the stages of the process for producing inductors.
Figure 6E:
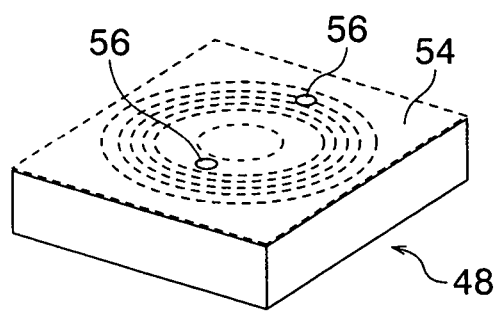
FIG. 6E is an enlarged view showing one unit in one of the stages of the process for producing inductors.

After the adhesive is cured and the coil bars 46 are adhered to the E-core 48, the substrate 30 is ground from the backside so that the end face of the coils 22 is exposed as shown in FIG. 5E and FIG. 6D. After the end face of the coils 22 has been exposed, an insulating material is applied to the ground surface at which the end face of the coils 22 is exposed so that a spacer layer 54 is formed, and then holes 56 are formed in the spacer layer 54 at the positions corresponding to both ends of each coil 22, as shown in FIG. 5F and FIG. 6E.

Figure 5G:
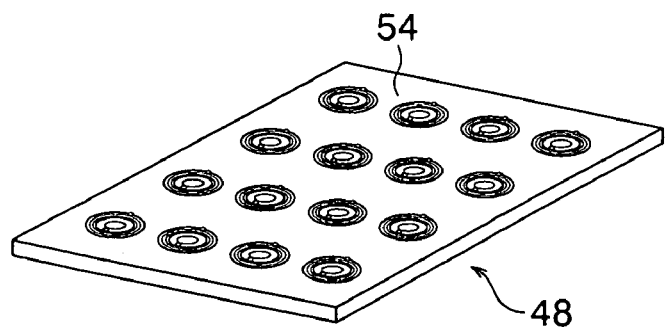
FIG. 5G is a process diagram for producing inductors.
Figure 6F:
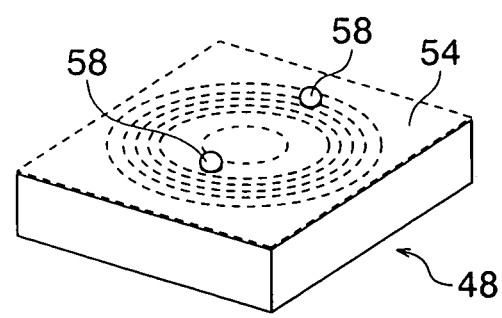
FIG. 6F is an enlarged view showing one unit in one of the stages of the process for producing inductors.

After the holes 56 are formed in the spacer layer 54, the end face of the coils 22 exposed at the holes 56 is nickel plated so that an oxide layer will not be formed. Then solder balls 58 are attached on the top layer as shown in FIG. 5G and FIG. 6F. The solder balls are melted in a reflowing process at a later stage, so that the holes 56 are stopped by the melted solder. Thus, lead-out portions for electrodes are formed.

Figure 5H:
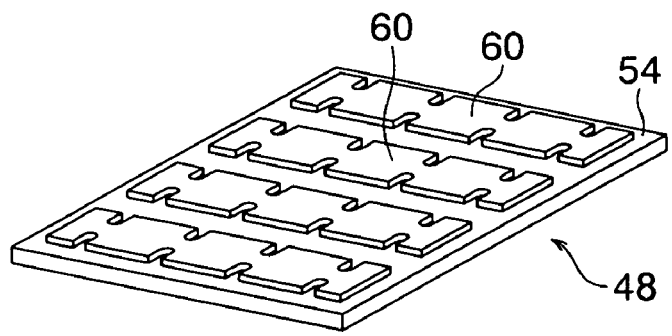
FIG. 5H is a process diagram for producing inductors.
Figure 5I:
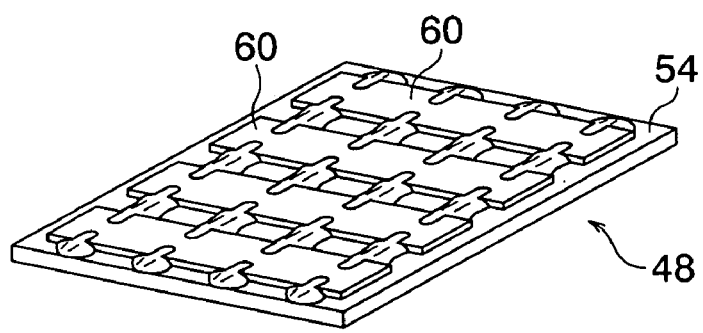
FIG. 5I is a process diagram for producing inductors.
Figure 5J:
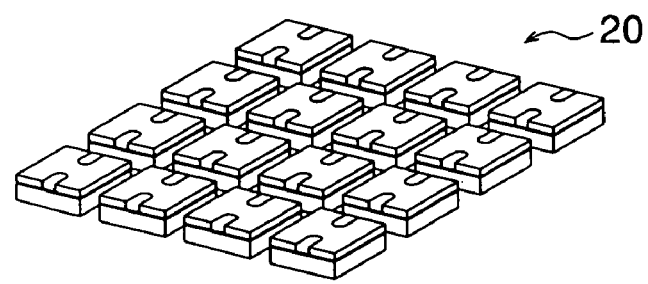
FIG. 5J is a process diagram for producing inductors.
Figure 6G:
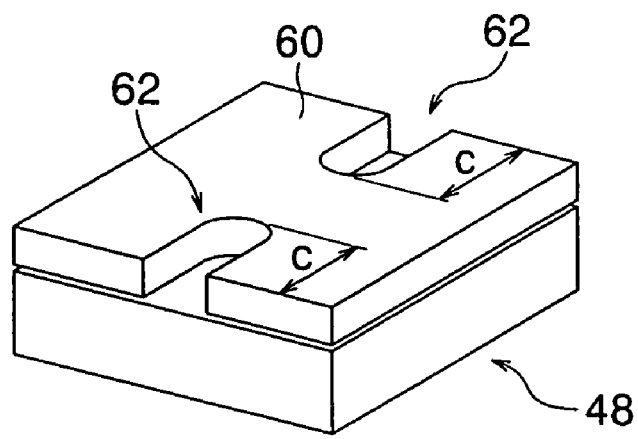
FIG. 6G is an enlarged view showing one unit in one of the stages of the process for producing inductors.
Figure 6H:
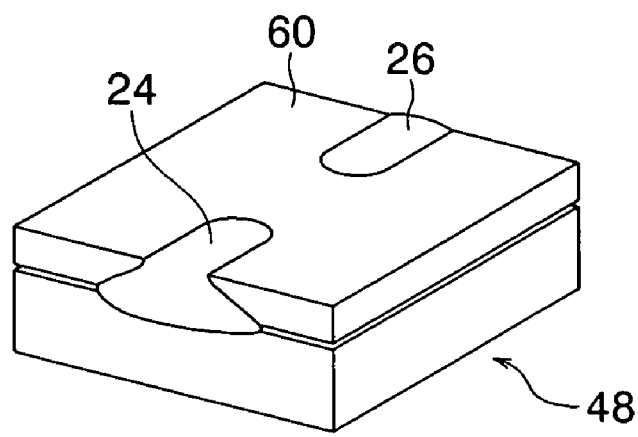
FIG. 6H is an enlarged view showing one unit in one of the stages of the process for producing inductors.
Figure 7A:
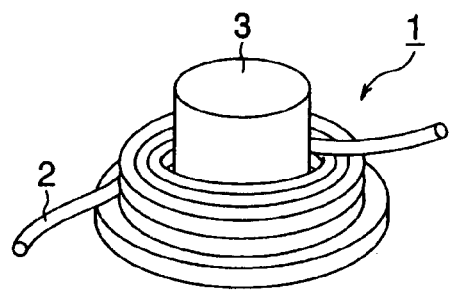
FIG. 7A is a perspective view showing an inductor according to a first prior art.
Figure 7B:
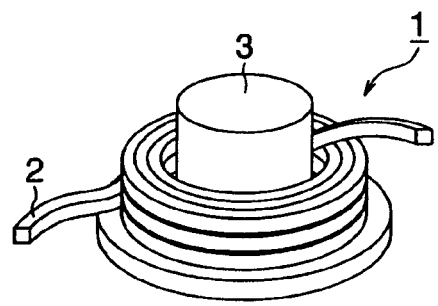
FIG. 7B is a perspective view showing the inductor according to the first prior art.
Figure 8A:
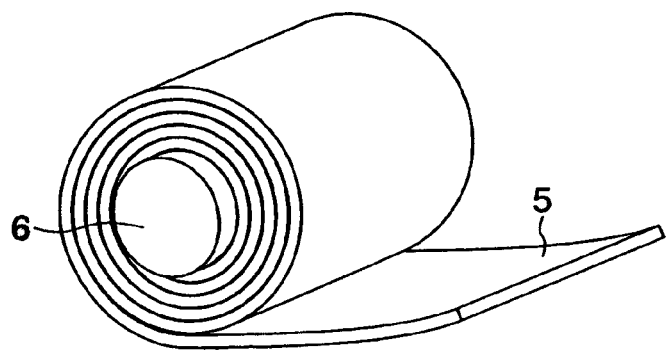
FIG. 8A illustrates a stage of a process for producing an inductor according to a second prior art.
Figure 8B:
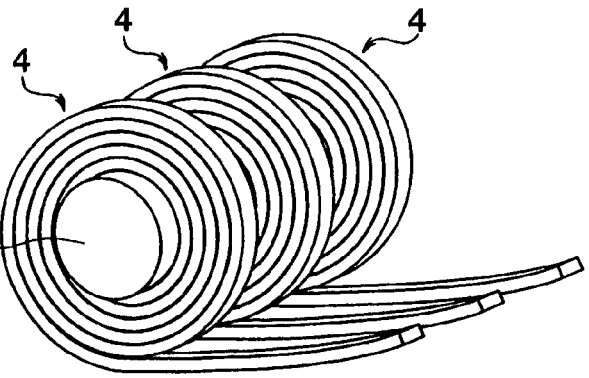
FIG. 8B illustrates a stage of the process for producing the inductor according to the second prior art.
Figure 9A:
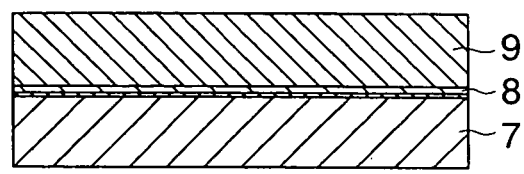
FIG. 9A is a process diagram illustrating a stage of process for forming a coil using thin film formation technology.
Figure 9B:
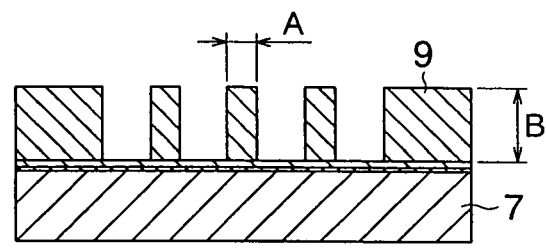
FIG. 9B is a process diagram illustrating a stage of the process for forming a coil using thin film formation technology.
Figure 9C:
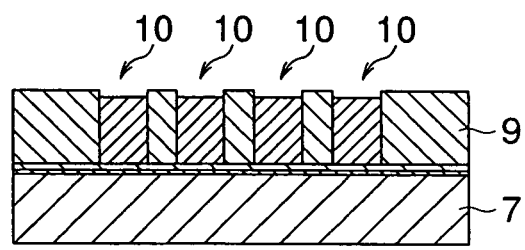
FIG. 9C is a process diagram illustrating a stage of the process for forming a coil using thin film formation technology.
Figure 9D:
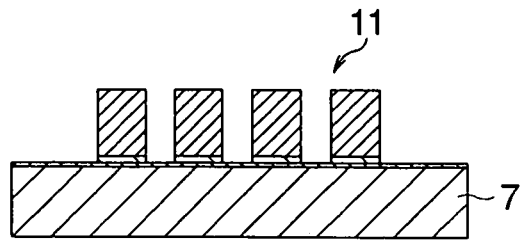
FIG. 9D is a process diagram illustrating a stage of the process for forming a coil using thin film formation technology.
Figure 10:
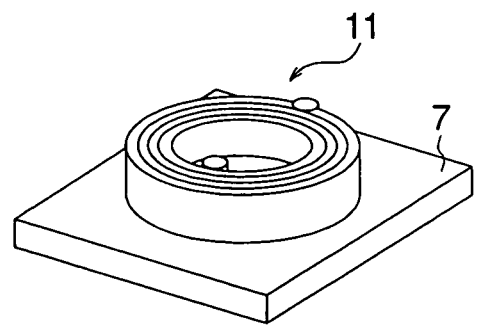
FIG. 10 is a perspective view showing a coil that is formed using thin film formation technology.
Figure 11A:
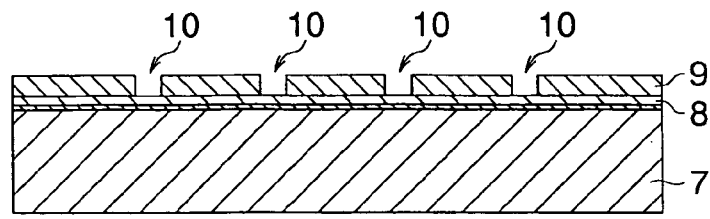
FIG. 11A illustrates a stage of a process for forming a coil using plating.
Figure 11B:
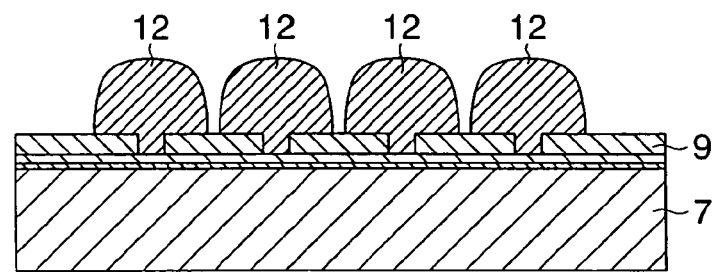
FIG. 11B illustrates a stage of the process for forming a coil using plating.
Figure 11C:
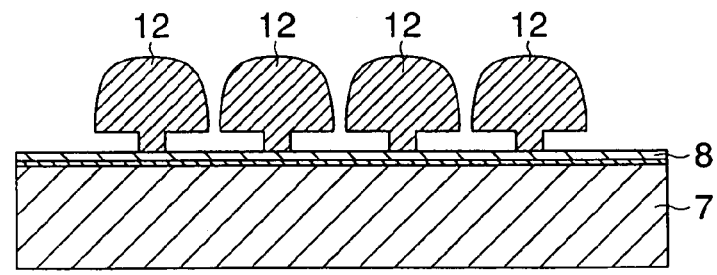
FIG. 11C illustrates a stage of the process for forming a coil using plating.
Figure 11D:
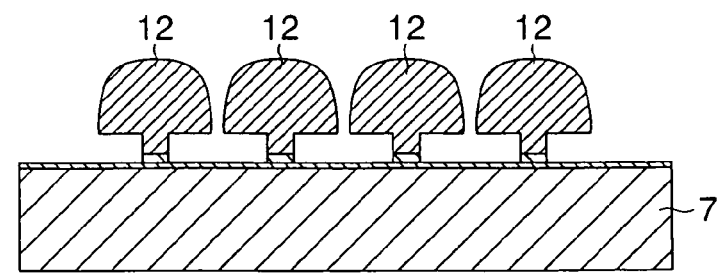
FIG. 11D illustrates a stage of the process for forming a coil using plating.
Figure 12:
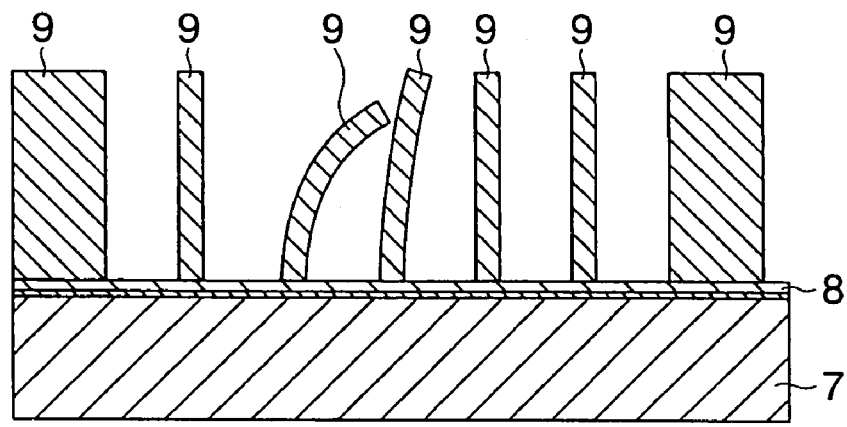
FIG. 12 shows a state in which resist is bent or removed.
Figure 13:
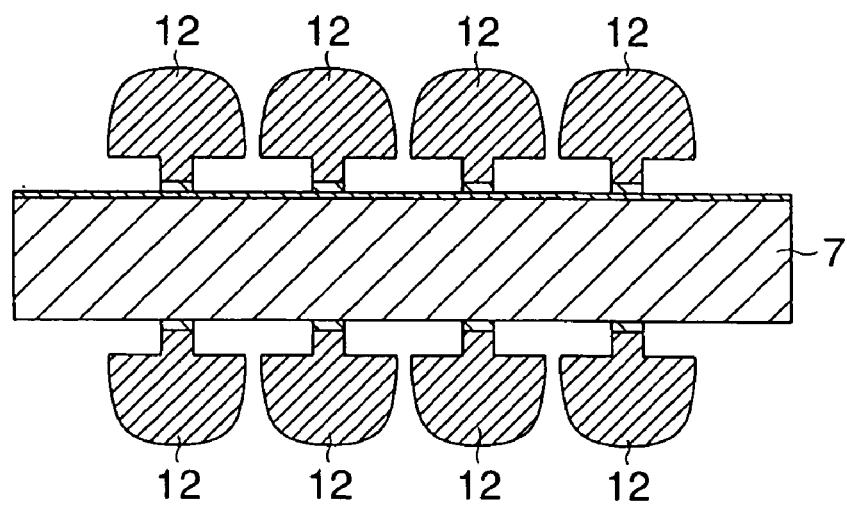
FIG. 13 is a cross sectional view showing a substrate on both side of which coils are formed.

After the holes 56 formed in the spacer layer 54 are stopped by solder so that electric conduction to the coils 22 are made possible, covers 60 made of a ferrite for constituting the core member together with the E-core 48 is attached to the surface of the spacer 54 as shown in FIG. 5H and FIG. 6G. Each cover has pairs of indentations 62 formed thereon. Each indentation 62 is designed to have a dimension (i.e. dimension C shown in FIG. 6G) corresponding to the length from the end face of the cover to the hole 56 that has been stopped by solder. The inner surface of the indentations 62 is covered with a metal film such as Cu or Ni applied by plating or sputtering or a solder film. The indentations 60 are filled with solder and connection terminals 24 and 26 are formed by a reflowing process. Thus, electric conduction to the coil 22 sealed by the E-core 48 and the cover 60 is allowed. Finally, as shown in FIG. 5J, they are cut into individual pieces by a cutter or the like, so that high density inductors according to the present invention are formed.

In the high density inductor 20 produced by the above-described process, what is accommodated in the recessed portion 50 is only the coil 22 as shown in FIG. 1B. Thus it is possible to reduce the size of the inductor 20 having a low resistance that generates little heat. In addition, it is possible to reduce the height of the inductor with the removal of the substrate by grinding.

As per the above, the high density inductor according to the present invention can be satisfactorily applied to hand-held devices or other devices that are required to be reduced in size and weight.

As has been described above, according to the present invention, there is provided a method for forming a high density inductor including a coil having a spiral shape and a core member disposed in such a way as to coincide with a path of a magnetic line of force generated by the coil, wherein the coil has a structure in which a plurality of wire layers are piled up in the thickness direction. The wire layers are formed by a thin film forming process or by a process including the steps of forming a coil having a spiral shape, sealing the coil in the interior of a core member, and forming a terminal electrode for allowing electric conduction to the coil on the outside of the core member. In this process, the coil is formed by repeating a process of forming a wire layer by means of a thin film forming process and a process of forming an additional wire layer on top the wire layer by means of the thin film forming process to pile up the wire layers. With this method, it is possible to produce a coil having a high aspect ratio. According to a preferred form of the invention, a dummy substrate on which the coil is formed is removed upon forming the inductor and only the coil is accommodated in the core member. With this feature, it is possible to reduce the size of the inductor and increase the density of the inductor.

Furthermore, according to a preferred form of the invention a lead-out pattern for the coil can be formed on the surface from which a dummy substrate has been removed after the coil is sealed so that terminal electrodes electrically connected with the coil are formed on the outer surface of the core member. With this feature, it is possible to reduce the size of the inductor as a whole.

In the case that the prime demand is reduction of the thickness of the inductor, the coil may be formed as a single layer. In this case also, it is possible with the present invention to reduce the size of the inductor by removal of a substrate and increase the density of the coil while reducing the cost.

What is claimed is:

1. A high density inductor comprising:
a coil having a spiral shape; and
a core member disposed in such a way as to be located on a path of a magnetic line of force generated by said coil;
wherein said coil has a wire formed by piling up a base electrode layer and a plurality of plating layers in this order along a thickness direction of the wire, and the base electrode layer is formed by a thin film forming process and the plating layers are formed by a plating process.

2. A high density inductor according to claim 1, wherein a ratio of the thickness of said coil to a width of said wire layers is equal to or more than 1.

* * * * *